US007994871B2

(12) United States Patent
Chen et al.

(10) Patent No.: US 7,994,871 B2
(45) Date of Patent: Aug. 9, 2011

(54) CHIP ON FILM TRACE ROUTING METHOD FOR ELECTRICAL MAGNETIC INTERFERENCE REDUCTION

(75) Inventors: Peng-Chi Chen, Tainan County (TW); Chih-Hsiang Lin, Tainan County (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 393 days.

(21) Appl. No.: 12/164,124

(22) Filed: Jun. 30, 2008

(65) Prior Publication Data
US 2009/0322441 A1    Dec. 31, 2009

(51) Int. Cl.
*H04B 3/28* (2006.01)
*H03H 7/00* (2006.01)
(52) U.S. Cl. .......................................... 333/12; 333/185
(58) Field of Classification Search .................... 333/12, 333/181, 185, 204, 205
See application file for complete search history.

(56) References Cited

U.S. PATENT DOCUMENTS

| 5,028,983 | A | * | 7/1991 | Bickford et al. ............... 257/668 |
| 5,285,018 | A | * | 2/1994 | Pence, IV ...................... 174/261 |
| 5,288,949 | A | * | 2/1994 | Crafts ........................... 174/250 |
| 6,483,714 | B1 | * | 11/2002 | Kabumoto et al. ........... 361/760 |
| 6,703,691 | B2 | * | 3/2004 | Chen et al. .................... 257/666 |
| 7,321,166 | B2 | * | 1/2008 | Sakai et al. .................... 257/700 |
| 7,609,125 | B2 | * | 10/2009 | van Quach et al. ............... 333/5 |

* cited by examiner

*Primary Examiner* — Robert Pascal
*Assistant Examiner* — Kimberly Glenn
(74) *Attorney, Agent, or Firm* — Winston Hsu; Scott Margo

(57) ABSTRACT

A chip on film (COF) trace routing method for EMI reduction includes: providing a flexible circuit board; mounting a chip that has a first signal pad, a second signal pad and a ground pad on the flexible circuit board; and forming a first signal trace, a second signal trace, a first ground trace and a second ground trace on the flexible circuit board. The first signal trace and the second signal trace are electrically connected to the first signal pad and the second signal pad respectively. The first ground trace and the second ground trace are both electrically connected to the ground pad. The first signal trace and the second signal trace are disposed between the first ground trace and the second ground trace. The first ground trace and the second ground trace are immediately adjacent to the first signal trace and the second signal trace respectively.

9 Claims, 1 Drawing Sheet

CHIP ON FILM TRACE ROUTING METHOD FOR ELECTRICAL MAGNETIC INTERFERENCE REDUCTION

BACKGROUND OF THE INVENTION

1. Field of the Invention

The present invention relates to a chip on film (COF), and more particularly, to a COF trace routing method for electrical magnetic interference (EMI) reduction.

2. Description of the Prior Art

COF, a packaging technique that requires less space for the I/O interconnections, has been widely used to manufacture components of electronic devices, such as driver ICs for liquid crystal displays (LCD). However, an undesirable EMI easily occurs when the components of the electronic devices manufactured by the COF packaging technique transmit high-speed signals (usually differential signals). Thus, the overall performance of the electronic devices is degraded due to the EMI effects. For this reason, how to suppress EMI effect has become a major issue for the COF packaging technique.

SUMMARY OF THE INVENTION

It is therefore one of the objectives of the present invention to provide a COF trace routing method for reducing the EMI effect, in order to solve the above-mentioned problem.

According to an exemplary embodiment of the present invention, a COF trace routing method is disclosed. The method comprises: providing a flexible circuit board; mounting a chip on the flexible circuit board, wherein the chip has a first signal pad, a second signal pad and a ground pad; forming a first signal trace on the flexible circuit board, wherein the first signal trace is electrically connected to the first signal pad for transmitting a first signal; forming a second signal trace on the flexible circuit board, wherein the second signal trace is electrically connected to the second signal pad for transmitting a second signal; forming a first ground trace on the flexible circuit board, wherein the first ground trace is electrically connected to the ground pad and is immediately adjacent to the first signal trace for EMI reduction; and forming a second ground trace on the flexible circuit board, wherein the second ground trace is electrically connected to the ground pad and is immediately adjacent to the second signal trace for EMI reduction. The first signal trace and the second signal trace are disposed between the first ground trace and the second ground trace.

According to an exemplary embodiment of the present invention, a COF structure is also disclosed. The COF structure comprises: a flexible circuit board; a chip, which is mounted on the flexible circuit board, wherein the chip has a first signal pad, a second signal pad and a ground pad; a first signal trace, which is formed on the flexible circuit board and electrically connected to the first signal pad for transmitting a first signal; a second signal trace, which is formed on the flexible circuit board and electrically connected to the second signal pad for transmitting a second signal; a first ground trace, which is formed on the flexible circuit board, is electrically connected to the ground pad, and is immediately adjacent to the first signal trace for EMI reduction; and a second ground trace, which is formed on the flexible circuit board, is electrically connected to the ground pad, and is immediately adjacent to the second signal trace for EMI reduction. The first signal trace and the second signal trace are disposed between the first ground trace and the second ground trace.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
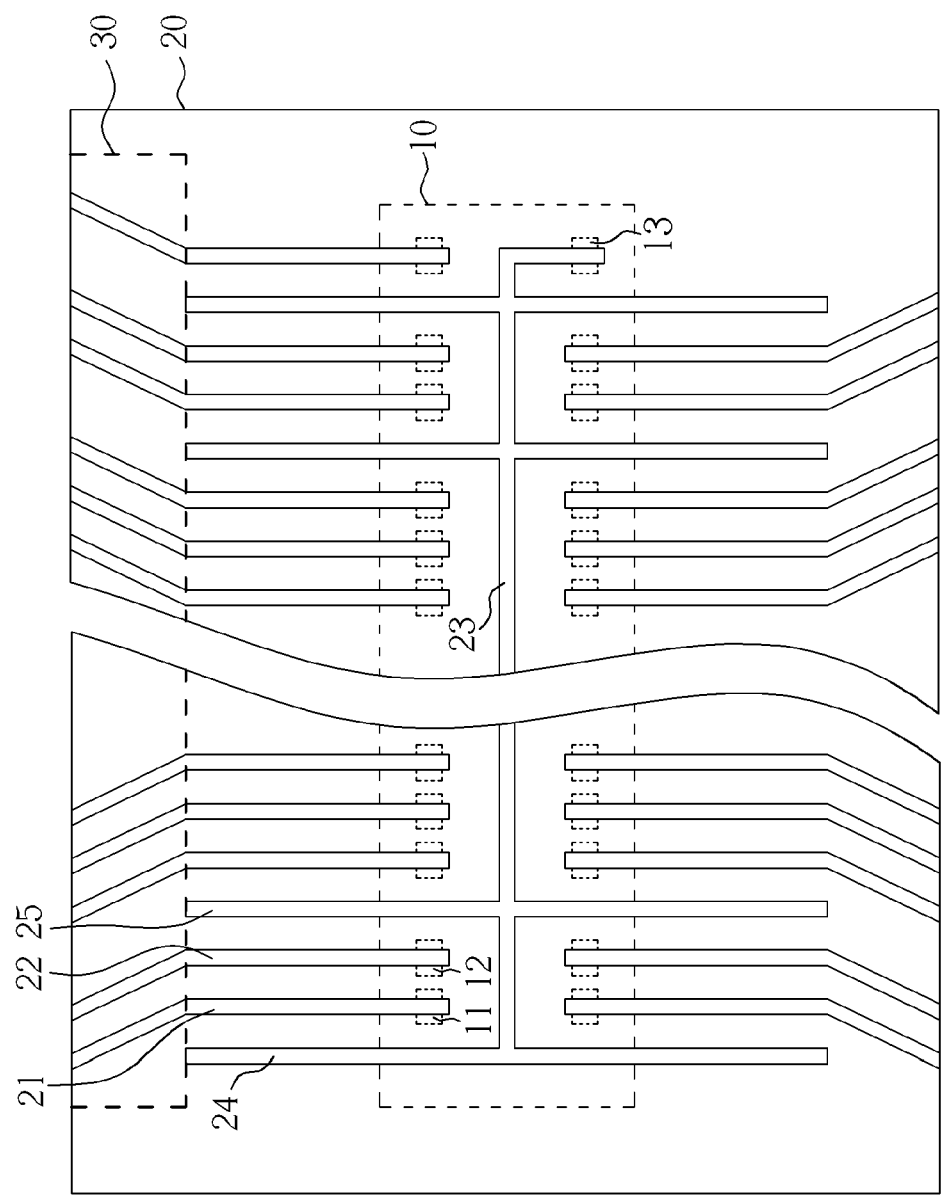
FIG. 1 is a simplified plane view illustrating a chip on film structure according to an embodiment of the present invention.

Please refer to FIG. 1. FIG. 1 is a simplified plane view illustrating a chip on film (COF) structure 100 according to an embodiment of the present invention. The COF structure 100 comprises a chip 10, such as a driver IC, and a flexible circuit board 20, such as a flexible printed circuit (FPC) board. The chip 10 has a plurality of pads, including a first signal pad 11, a second signal pad 12 and a ground pad 13. The flexible circuit board 20 has a plurality of wiring traces, including a first signal trace 21, a second signal trace 22, a central ground trace 23, a first ground trace 24 and a second ground trace 25. Further description of the COF structure 100 is detailed as follows; however, this description is merely for greater clarity of understanding, and should not be taken as limiting the present invention.

The first and second signal traces 21, 22 are immediately adjacent to one another, and are disposed between the first ground trace 24 and the second ground trace 25, which are symmetric with respect to each other. The first ground trace 24 is immediately adjacent to, and parallel with the first signal trace 21. Symmetrically, the second ground trace 25 is immediately adjacent to, and parallel with the second signal trace 22. In addition, an interval between the first signal trace 21 and the first ground trace 24 is as wide as an interval between the second signal trace 22 and the second ground trace 25, and a line width of the first ground trace 24 is as wide as a line width of the second ground trace 25. Furthermore, the first and second ground traces 24, 25 are extended from the central ground trace 23 until a fan-out area 30, at which the first and second signal traces 21, 22 make a turn immediately before entering.

The chip 10 is mounted on the flexible circuit board 20 by bounding the plurality of pads of the chip 10 onto the inner leads of some of the plurality of wiring traces on the flexible circuit board 20, as shown in FIG. 1. The first signal trace 21 is electrically connected to the first signal pad 11 for transmitting a first signal outputted from the first signal pad 11. The second signal trace 22 is electrically connected to the second signal pad 12 for transmitting a second signal outputted from the second signal pad 12. Both the first signal and the second signal are, respectively, high-speed signals at a transfer rate over 10 MHz. In this embodiment, the first signal and the second signal are a differential signal pair, and the first and second signal traces 21, 22 are a differential signal trace pair for transmitting the differential signal pair. In practice, the first and second signal traces 21, 22 are respectively positive polarity and negative polarity.

In addition, the first and second ground traces 24, 25 are electrically connected to the ground pad 13 via the central ground trace 23. The ground pad 13 provides the first and second ground traces 24, 25 with a ground voltage level, so that the first and second ground traces 24, 25 can shield the EMI generated from transmitting the differential signal pair (i.e., high-speed signals) by the first and second signal traces 21, 22.

In the above embodiment, the first and second ground traces 24, 25 are straight lines as are the first and second signal traces 21, 22, and are in parallel with the first and second signal traces 21, 22. However, this is only a preferred embodiment of the present invention and not a limitation of the present invention. In practice, any ground traces having the capability to reduce the EMI effect obeys the spirit of the present invention.

Briefly summarized, the present invention utilizes disposing high-speed signal traces between the ground traces, which are connected to a ground voltage level and are symmetric with respect to each other, to achieve the objective of EMI reduction.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip on film (COF) trace routing method for electrical magnetic interference (EMI) reduction, comprising:
   providing a flexible circuit board;
   mounting a chip on the flexible circuit board, wherein the chip has a first signal pad, a second signal pad and a ground pad;
   forming a first signal trace on the flexible circuit board, wherein the first signal trace is electrically connected to the first signal pad for transmitting a first signal;
   forming a second signal trace on the flexible circuit board, wherein the second signal trace is electrically connected to the second signal pad for transmitting a second signal;
   forming a first ground trace on the flexible circuit board, wherein the first ground trace is electrically connected to the ground pad and is immediately adjacent to the first signal trace for EMI reduction; and
   forming a second ground trace on the flexible circuit board, wherein the second ground trace is electrically connected to the ground pad and is immediately adjacent to the second signal trace for EMI reduction;
   wherein the first signal trace and the second signal trace are disposed between the first ground trace and the second ground trace; the first ground trace and the second ground trace are symmetric with respect to each other; and the first signal trace is immediately adjacent to the second signal trace; the first signal trace is parallel with the first ground trace, the second signal trace is parallel with the second ground trace, and an interval between the first signal trace and the first ground trace is as wide as an interval between the second signal trace and the second ground trace.

2. The method of claim 1, wherein each of the first signal and the second signal is a high-speed signal at a transfer rate over 10 MHz.

3. The method of claim 1, wherein a line width of the first ground trace is as wide as a line width of the second ground trace.

4. The method of claim 1, wherein the first signal and the second signal is a differential signal pair, and the first signal trace and the second signal trace is a differential signal trace pair for transmitting the differential signal pair.

5. A chip on film (COF) structure for electrical magnetic interference (EMI) reduction, comprising:
   a flexible circuit board;
   a chip, mounted on the flexible circuit board, wherein the chip has a first signal pad, a second signal pad and a ground pad;
   a first signal trace, formed on the flexible circuit board, electrically connected to the first signal pad for transmitting a first signal;
   a second signal trace, formed on the flexible circuit board, electrically connected to the second signal pad for transmitting a second signal;
   a first ground trace, formed on the flexible circuit board, electrically connected to the ground pad and immediately adjacent to the first signal trace for EMI reduction; and
   a second ground trace, formed on the flexible circuit board, electrically connected to the ground pad and immediately adjacent to the second signal trace for EMI reduction;
   wherein the first signal trace and the second signal trace are disposed between the first ground trace and the second ground trace; the first ground trace and the second ground trace are symmetric with respect to each other; and the first signal trace is immediately adjacent to the second signal trace; the first signal trace is parallel with the first ground trace, the second signal trace is parallel with the second ground trace, and an interval between the first signal trace and the first ground trace is as wide as an interval between the second signal trace and the second ground trace.

6. The COF structure of claim 5, wherein each of the first signal and the second signal is a high-speed signal at a transfer rate over 10 MHz.

7. The COF structure of claim 5, wherein a line width of the first ground trace is as wide as a line width of the second ground trace.

8. The COF structure of claim 5, wherein the first signal and the second signal is a differential signal pair, and the first signal trace and the second signal trace is a differential signal trace pair for transmitting the differential signal pair.

9. A chip on film (COF) structure for electrical magnetic interference (EMI) reduction, comprising:
   a flexible circuit board;
   a chip, mounted on the flexible circuit board, wherein the chip has a first signal pad, a second signal pad and a ground pad;
   a first signal trace, formed on the flexible circuit board, electrically connected to the first signal pad for transmitting a first signal;
   a second signal trace, formed on the flexible circuit board, electrically connected to the second signal pad for transmitting a second signal;
   a first ground trace, formed on the flexible circuit board, electrically connected to the ground pad and immediately adjacent to the first signal trace for EMI reduction; and
   a second ground trace, formed on the flexible circuit board, electrically connected to the ground pad and immediately adjacent to the second signal trace for EMI reduction;
   wherein the first signal trace and the second signal trace are disposed between the first ground trace and the second ground trace; the first signal trace is parallel with the first ground trace, and the second signal trace is parallel with the second ground trace; and an interval between the first signal trace and the first ground trace is as wide as an interval between the second signal trace and the second ground trace.

* * * * *